(12) United States Patent
Shibata et al.

(10) Patent No.: US 6,495,883 B2
(45) Date of Patent: Dec. 17, 2002

(54) TRENCH GATE TYPE SEMICONDUCTOR DEVICE AND METHOD OF MANUFACTURING

(75) Inventors: Takumi Shibata, Kariya (JP); Shoichi Yamauchi, Obu (JP); Yasushi Urakami, Tokai (JP); Toshiyuki Morishita, Iwakura (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/060,379

(22) Filed: Feb. 1, 2002

(65) Prior Publication Data

US 2002/0104988 A1 Aug. 8, 2002

(30) Foreign Application Priority Data

Feb. 6, 2001 (JP) .................................. 2001-029975

(51) Int. Cl.[7] .................. H01L 29/76; H01L 29/94; H01L 31/062; H01L 31/113; H01L 31/119
(52) U.S. Cl. ................ 257/331; 257/332; 257/334; 257/627; 438/270; 438/272
(58) Field of Search ................ 257/329, 330, 257/331, 332, 333, 334, 521, 627, 628; 438/270, 272

(56) References Cited

U.S. PATENT DOCUMENTS 3,761,785 A * 9/1973 Pruniaux
5,808,340 A * 9/1998 Wollesen et al. .......... 257/330
5,915,180 A  6/1999 Hara et al.
6,194,273 B1 * 2/2001 Matsuura et al. .......... 438/270

FOREIGN PATENT DOCUMENTS

| EP | 0354449 A2 | 2/1990 |
| GB | 2032686 | 5/1980 |
| JP | A-55-18022 | 2/1980 |
| JP | A-9-213951 | 8/1997 |
| JP | A-10-154810 | 6/1998 |
| JP | A-10-326895 | 12/1998 |

* cited by examiner

Primary Examiner—Ngân V. Ngô
(74) Attorney, Agent, or Firm—Law Offices of David G. Posz

(57) ABSTRACT

A semiconductor device has a dielectric strength for a gate oxide film at a trench bottom that is higher than that of side walls used for channels. An $n^+0$ type substrate 1 having substrate plane orientation of (110) is prepared, and the side walls of a trench where channels are formed are in (100) planes. The other, non-channel forming, side walls of the trench are in (110) planes. Thus, the growth rate of the gate oxide film 7 in the non-channel forming side walls and the trench bottom is faster than that in the channel forming side walls. As a result, the film thickness at the non-channel-forming side walls and the trench bottom is greater than that of the channel-forming side walls. Accordingly, the device has high mobility, and there is no drop of dielectric strength due to partial reduction of the thickness of the gate oxide film 7. This achieves both a reduction of the ON resistance and an increase in the dielectric strength of the semiconductor device.

19 Claims, 8 Drawing Sheets

(100) (●), (110) (▲), (111) (■)
GROWTH PROFILE OF OXIDE FILM IN DRY OXIDATION
AT 800°C FOR THREE SILICON CRYSTAL ORIENTATIONS

TRENCH GATE TYPE SEMICONDUCTOR DEVICE AND METHOD OF MANUFACTURING

CROSS REFERENCES TO RELATED APPLICATIONS

This application relates to and incorporates by reference Japanese Patent application No. 2001-29975 filed on Feb. 6, 2001.

BACKGROUND OF THE INVENTION

The present invention relates to a trench gate type semiconductor device where a trench gate is formed on a silicon wafer and to a method of manufacturing a trench gate type semiconductor.

A silicon substrate including a substrate surface in a (100) plane orientation and an orientation flat in a (110) plane orientation has been used for manufacturing an insulated gate type semiconductor device such as a MOSFET, an IGBT or the like where a gate electrode is located within a trench.

In this case, since the trench of a trench gate usually has parallel side walls that are perpendicular to the orientation flat, the side walls are located in (110) planes. However, since mobility at a (110) plane is lower than that at a (100) plane, when a channel is formed at a (110) plane, the channel resistance is relatively high, which undermines the goal of reducing the ON resistance of elements.

Therefore, as explained in Japanese unexamined patent application publication (JP-A) No.H2-46716, the side wall surface of a trench gate is located in a (100) plane, which results in higher mobility, and the channel resistance is reduced, which reduces the ON resistance. This is done by using a silicon substrate having a surface in a (100) plane and an orientation flat in a (100) plane.

It is widely known that the growth rate of an oxide film is dependent on the plane orientation when a silicon oxide film is grown through thermal oxidation of silicon. Such dependence is shown in FIG. 7. As indicated by this figure, mobility is relatively high but the oxidation rate is the lowest at the plane (100). On the contrary, mobility at the planes (111) and (110) is lower than that at the plane (100) but the oxidation rate at these planes is higher.

In the trench described in unexamined patent publication (JP-A) No.H2-46716, the side walls and the trench bottom, where the channel is formed, are all located in (100) planes, thus the mobility at each plane in the trench is high and the growth rate of oxide film formed at each plane is does not vary from one surface of the trench to another.

It is preferred that the dielectric strength of a gate oxide film formed within the trench be higher at the trench bottom than that at the side walls, since the side walls are usually used to form a channel. However, when an effort is made to improve the dielectric strength of the film at the trench bottom by increasing the thickness of the film at the bottom, the thickness of the film at the side walls also increases, and the ON resistance of the element increases.

Thus, when the plane orientation is like that in unexamined patent publication (JP-A) No.H2-46716, there is an advantage with regard to the dielectric strength because the gate oxide film thickness of the side walls and the bottom, which are used as the channel, are identical due to the dependence on the plane orientation of the growth rate of the oxide film.

However, if the aspect ratio of the trench is high, for example, when the trench depth is 15 μm or more, less oxidation gas is supplied to the trench bottom during thermal oxidation, and the film thickness 15 at the bottom of the side walls is less than the film thickness 14 at the area near the opening of the trench 51. Thus, the film thickness 16 at the trench bottom is relatively low as shown in the cross-sectional view of the gate oxide film 50 of FIG. 8A. In the case of an element oriented like the MOS transistor proposed in the unexamined patent publication mentioned above, the reduction of the thickness of the gate oxide film at the trench bottom part is significant because the trench gate is deeper, for example, deeper than 15 μm or more, for reducing the ON resistance.

As explained above, when forming a trench gate on a silicon substrate that has a surface in a (100) plane and an orientation flat in a (110) plane, the growth rate at the bottom of the trench 51, which is in a (100) plane, is low, as shown in the cross-sectional view of the gate oxide film 50 of FIG. 8B. Thus, this arrangement is disadvantageous with regard to dielectric strength.

SUMMARY OF THE INVENTION

Considering the background above, it is an object of the present invention to provide a trench gate type semiconductor device in which the dielectric strength of a gate oxide film is higher at the trench bottom than at a pair of side walls that are used for forming a channel.

The invention is basically a trench gate type semiconductor device that includes a silicon substrate, in which semiconductor layers are formed. The silicon substrate includes a main surface and a rear surface, the rear surface being opposite to the main surface. The main surface is in a (110) plane. A trench is formed in the semiconductor layers, and the trench has at least a first pair and a second pair of opposed sidewalls, and the first pair of sidewalls are in (100) planes. A gate oxide film, which is formed by thermally oxidizing the walls of the trench, coats the surfaces of the trench. A gate electrode is located on the gate oxide film inside the trench, and channels are formed at the first pair of side walls when a predetermined voltage is applied to the gate electrode.

The invention includes a method, which basically includes preparing a silicon substrate that includes semiconductor layers. The substrate has a main surface and a rear surface. The main surface is opposite to the rear surface and is oriented in a (110) plane. The method further includes forming a trench in the semiconductor layers, such that the trench has at least a first pair and a second pair of opposed sidewalls, and the first pair of sidewalls are in (100) planes. A gate oxide film is formed by thermally oxidizing the walls of the trench. Then, a gate electrode is formed on the gate oxide film inside the trench such that channels are formed at the walls that are in (100) planes when a predetermined voltage is applied to the gate electrode.

DETAILED DESCRIPTION OF THE PREFERRED EMBODIMENTS

First Embodiment

Figure 1:
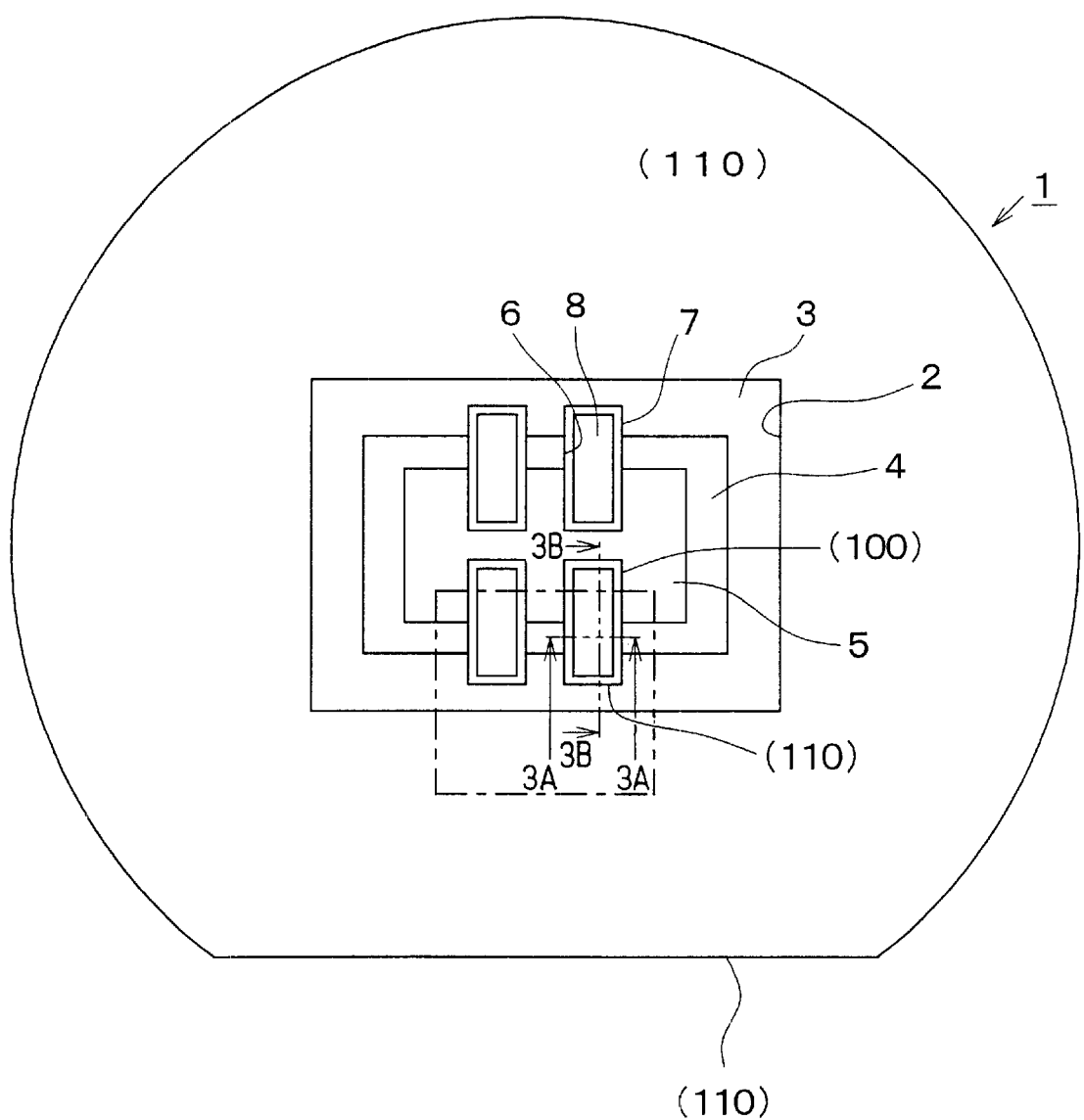
FIG. 1 is a top view of a power MOSFET of a first embodiment of the present invention.

The first embodiment, including a method of manufacturing the power MOSFET of this embodiment, will be explained with reference to FIGS. 1, 2, 3A, and 3B.

The power MOSFET is a semiconductor device formed on an $n^+$-type silicon substrate 1, which has a (110) plane orientation. That is, the surface of the substrate is in the (110) plane. The substrate has an orientation flat in the (110) plane. The silicon substrate 1 is called the $n^+$-type substrate. The upper surface of the $n^+$-type substrate in the drawings is called a main surface 1a, and the opposite surface is called a rear surface 1b.

Figure 2:
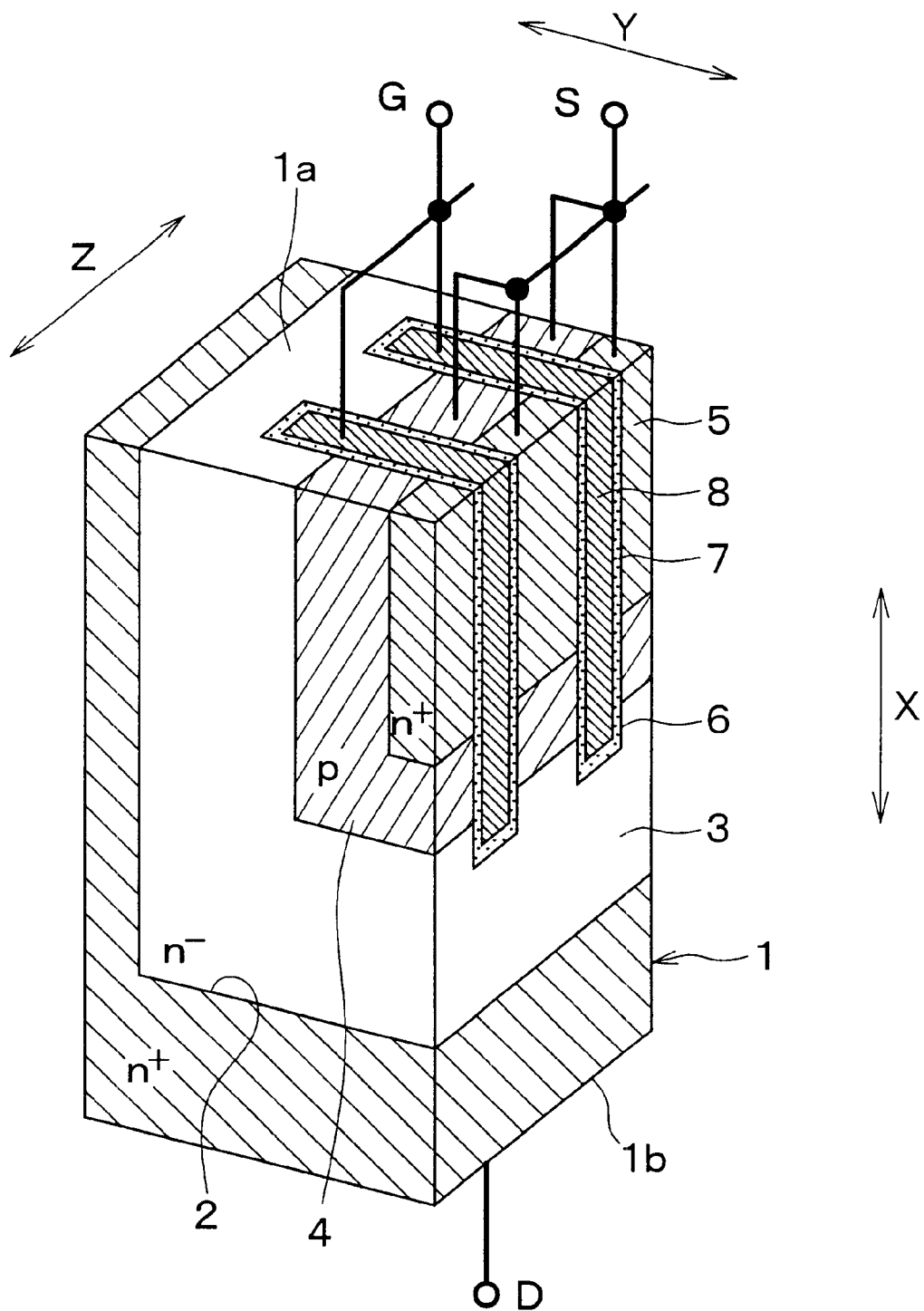
FIG. 2 is a cross-sectional perspective view of the power MOSFET shown in FIG. 1 taken along the broken line in FIG. 1.

The power MOSFET has an X, Y, and Z directions as indicated by arrows in FIG. 2. The X, Y and Z directions are respectively perpendicular to each other.

A trench 2 is formed to a predetermined depth in the main surface 1a of the substrate 1 and an $n^-$-type drift layer 3 is embedded within this trench. In addition, a p-type base region (p-type well region) layer 4 is formed to a predetermined depth from the main surface 1a of the substrate 1. The p-type base region layer 4 is set, for example, to a thickness of 15 μm or more and is slightly shallower than the $n^-$-type drift layer 3.

Within the p-type base region layer 4, an $n^+$-type source region layer 5 is formed and is more shallow than the p-type base region layer 4 as shown in FIG. 2. The $n^+$-type source region layer 5 is formed to a depth of 15 μm or more but is slightly more shallow than the p-type base region layer 4.

Figure 3A:
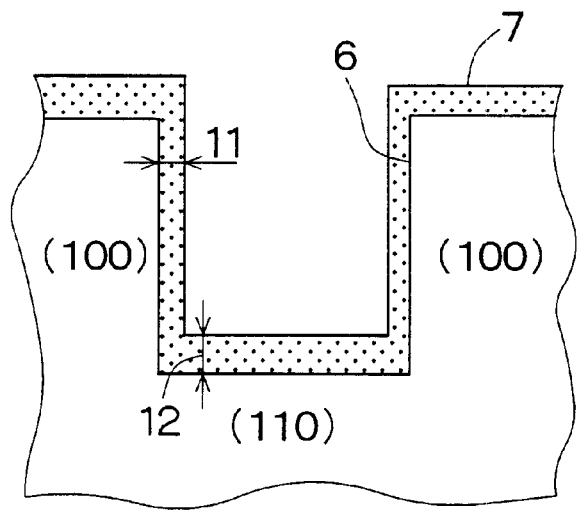
FIG. 3A is a cross sectional diagram of a gate oxide film 7 of the power MOSFET shown in FIG. 1 taken along the line 3A—3A of FIG. 1.
Figure 3B:
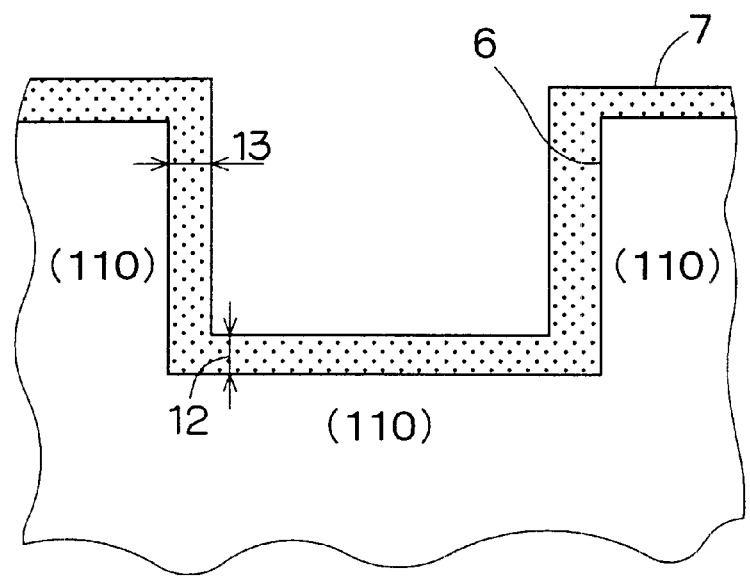
FIG. 3B is a cross sectional diagram of a gate oxide film 7 of the power MOSFET shown in FIG. 1 taken along the line 3B—3B of FIG. 1.

A plurality of trenches 6 are formed vertically (in the X direction) from the main surface 1a of the $n^+$ substrate 1 as shown. (Since the trenches are identical, only one is described herein.) The trench 6 is substantially rectangular when viewed from the top. The trench 6 has two sets of side walls opposed to each other. One set of side walls are in (100) planes, and the other set are in (110) planes as indicated in FIGS. 3A and 3B. The bottom surface of the trench 6 is in a (110) plane. The trench 6 is formed to extend through the p-type base region layer 4 from the $n^+$-type source region layer 5 in the Y direction as shown in FIG. 2.

A gate oxide film 7 is also formed with thermal oxidation on the surface of trench 6. FIGS. 3A and 3B show the gate oxide films 7 at the side walls and the bottom surface of the trench 6. As shown in FIGS. 3A and 3B, the thickness 11 of the gate oxide film 7 formed on the side walls that are in (100) planes is less than the thickness 13 of the film 7 formed on the side walls that are in (110) planes and less than the thickness 12 of the film 7 on the trench bottom. A gate electrode 8 is formed on the gate oxide film 7, and the inside of the trench 6 is filled with the gate oxide film 7 and the gate electrode 8. Although only a few gate electrode structures are shown in FIG. 1 and FIG. 2, many gate electrode structures are actually formed in the Z direction of FIG. 2.

A gate wiring, which is connected to the gate electrode 8, and a source electrode, which is connected to the $n+$-type source region layer 5 and the p-type base region layer 4, are located on the side of the main surface 1a of the substrate 1 as shown in FIG. 2. The $n+$ type substrate 1 serves as a drain region, and a drain electrode, which is located on the side of the rear surface 1b, is connected to the $n+$ type substrate 1.

In the MOSFET of this embodiment, when a predetermined voltage is applied to the gate electrode 8, channels are formed in parts that contact the gate oxide film 7 of the p-type base region layer 4. That is, channels are formed at parts forming the side walls of the trench 6 of the ptype base region layer 4, and a current is permitted to flow between the $n^+$ type source region 4 and the drain region ($n^+$ type substrate 1) via the channels and the $n^-$-type drift layer 3.

Since channels are formed at the side walls of the trench 6 that are in the (100) plane, higher mobility is assured. Therefore, the ON resistance of the power MOSFET is reduced.

The gate oxide film 7 is thinner at the side walls of the trench 6 that are in (100) planes than at the other two side walls and the bottom of the trench, which are in (110) planes. Also, the film 7 is thinnest at the locations where channels are formed. Accordingly, a drop of the dielectric strength due to partial reduction of the thickness of the gate oxide film 7 is prevented.

Therefore, both a reduction of the ON resistance and an increase of dielectric strength are achieved by the power MOSFET of this invention.

An exemplary method for manufacturing the power MOSFET of this embodiment will be explained below.

First, an $n^+$-type substrate 1 is prepared with a (110) plane orientation and an orientation flat in the (110) plane. After the trench 2 is formed in the $n^+$-type substrate 1, the $n^-$-type layer, which becomes the $n^-$ type drift layer 3, the p-type layer, which becomes the p-type base region layer 4, and the $n^+$-type layer, which becomes the $n^+$-type source region layer 5 are sequentially and epitaxially grown to fill the inside of the trench 2 formed in the main surface 1a of the substrate 1.

After the $n^-$-type layer, the p-type layer and the $n^+$-type layer are etched back until the main surface 1a of the $n^+$ type substrate 1 is exposed, the trench 6 is formed by wet-etching (TMAH) of the main surface 1a. That is, the trench 6 is formed through mask alignment to align one pair of side walls of the trench 6 with (100) planes and the other pair with (110) planes. Thus, the trench 6 is formed such that the side walls are vertical to the main surface 1a, the side walls have the plane orientation explained above, and the bottom surface is in a (110) plane, like the main surface 1a.

In this process, since the orientation flat formed on the $n^+$ type substrate 1 is in a (110) plane, it is sufficient to align the masks such that the masks are perpendicular or parallel to this part. As a result, the mask alignment is relatively simple.

The gate oxide film 7 is formed by thermal oxidation within the trench 6. Since the plane orientation of the side walls where a channel is formed is in a (100) plane, and since the other side walls and bottom surface are in (110) planes, the growth rate of the gate oxide film 7 on the other side walls and the bottom surface is greater. Therefore, the film is thinner at the location where a channel is formed as shown in FIG. 3A and FIG. 3B. In addition, if the trench 6 has a higher aspect ratio, it may happen that relatively little oxidation gas is supplied to the bottom surface of the trench 6. However, even if only a small amount of oxidation gas is supplied, the gate oxide film 7 formed on the other side walls and the bottom surface, which are in (110) planes, becomes thicker than that formed on the side walls in the (100) planes, where channels are formed, because of the dependence of the growth rate of the oxide film on the plane orientation.

Thereafter, the gate electrode 8 is formed by forming a polysilicon layer on the gate oxide film 7 and by patterning the polysilicon layer. A source electrode is then formed in the side of the main surface 1a, and a drain electrode is formed in the side of the rear surface 1b to create a power MOSFET.

As explained above, the thickness of the gate oxide film 7 can be determined according to the relationship explained above by making the $n^+$-type substrate 1 such that its surface is in the (110) plane and by forming the side walls of the trench where a channel is formed in (100) planes. The remaining two side walls are formed in (110) planes.

Accordingly, higher channel mobility is assured and a drop in the dielectric strength due to a partial reduction in the thickness of the gate oxide film 7 is prevented. Thus, both a reduction of the ON resistance and an increase in the dielectric strength of the power MOSFET are accomplished.

Second Embodiment

Figure 4:
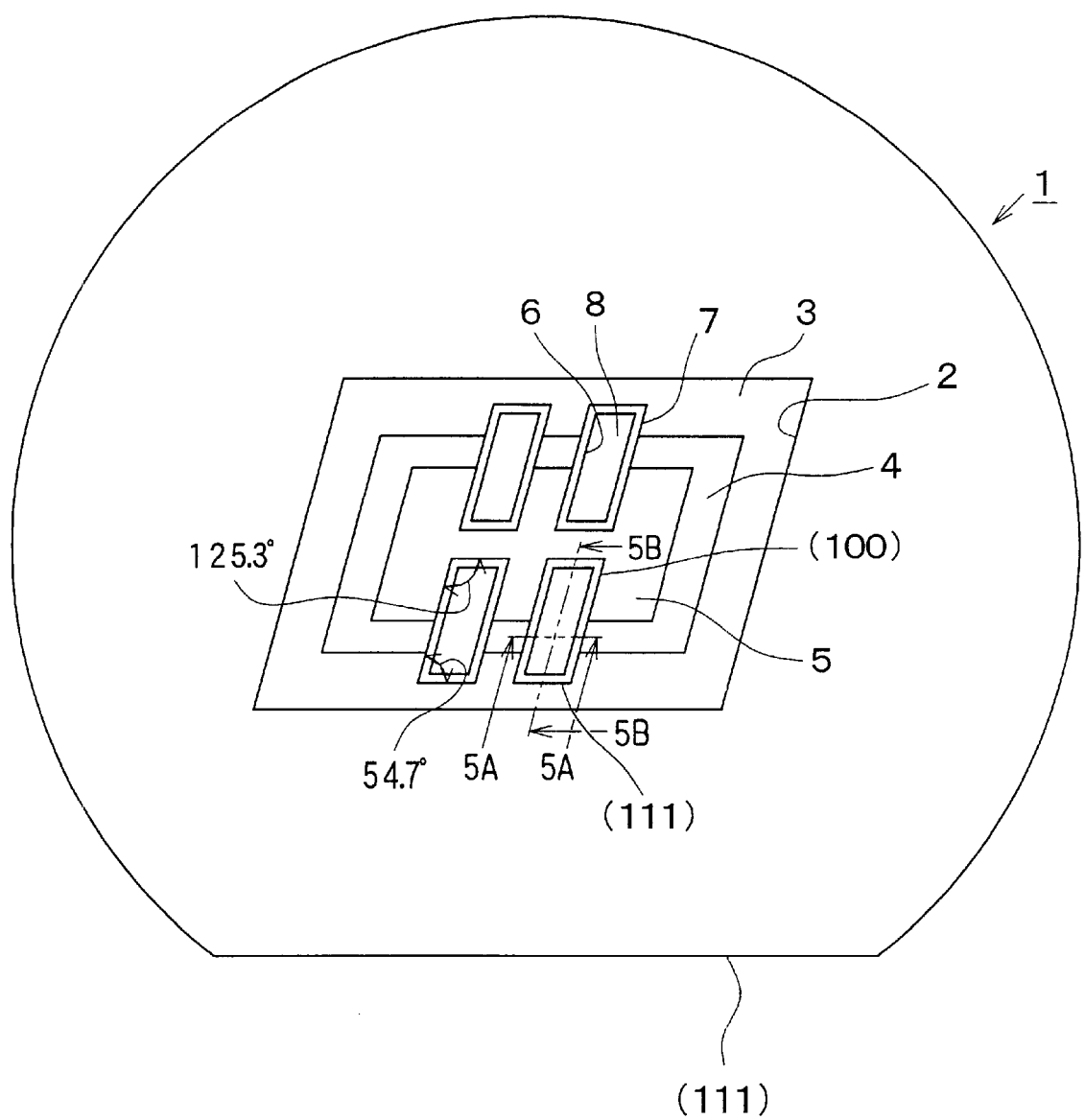
FIG. 4 is a top view of a power MOSFET of a second embodiment of the present invention.
Figure 5A:
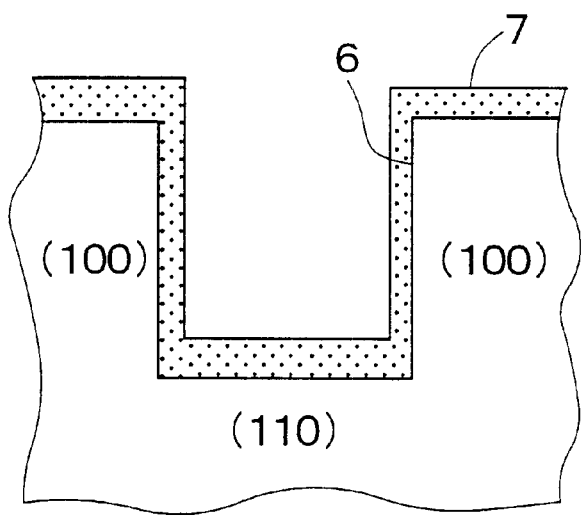
FIG. 5A is a cross sectional diagram of a gate oxide film 7 of the power MOSFET shown in FIG. 4 taken along the line 5A—5A of FIG. 4.
Figure 5B:
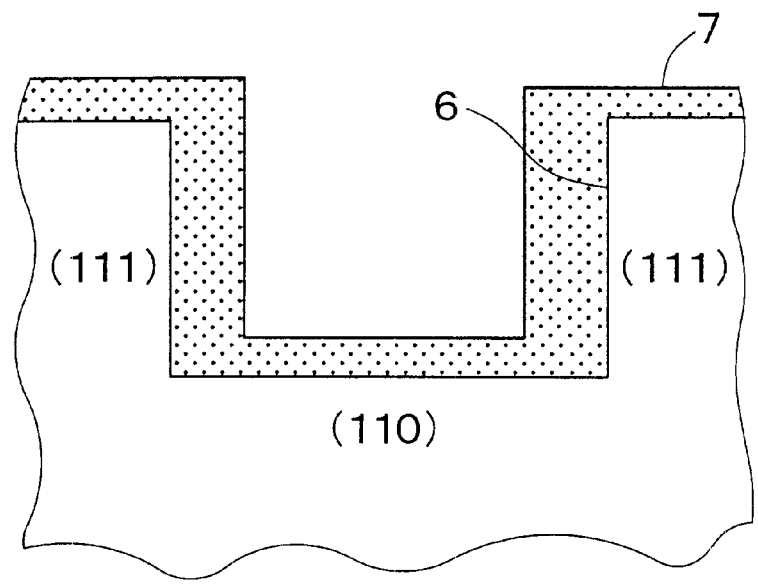
FIG. 5B is a cross sectional diagram of a gate oxide film 7 of the power MOSFET shown in FIG. 4 taken along the line 5B—5B of FIG. 4.

FIG. 4, FIG. 5A and FIG. 5B show a second embodiment. In this embodiment, only parts that differ from the first embodiment will be explained. Only the plane orientation of the orientation flat formed on the n+ type substrate 1 and the layout structure of the trench 6 are different from those of the first embodiment, and the basic structure of the power MOSFET is the same.

In the first embodiment, the orientation flat is in a (110) plane. However, in this embodiment, the orientation flat is in a (111) plane. However, the main surface of the $n^+$-type substrate 1 is in a (110) plane, as in the first embodiment. Also, in the first embodiment, the shape of the trench 6 as viewed from the top is substantially rectangular, and the side walls of the trench 6 are in (100) and (110) planes. However, in the second embodiment, the shape of the trench 6 in the plan view is a parallelogram, and the side walls are in (100) and (111) planes. Channels are formed at the side walls of the trench 6 that are in (100) planes, where the mobility is higher.

In the trench 6 of the second embodiment, the growth rate of the gate oxide film 7 formed at the internal walls of the trench 6 is faster at the sidewalls that are in the (111) plane and at the trench bottom than that at the side walls in (100) planes, where channels are formed. Therefore, as shown in FIG. 5A and FIG. 5B, the thickness of the gate oxide film 7 at the trench bottom, which is in a (110) plane, and the thickness of the side walls that are in (111) planes are significantly greater than the thickness of the film 7 on the side walls that are in (100) planes.

Therefore, even when the side walls of the trench 6 are in (100) and (111) planes, higher channel mobility results, and a drop in the dielectric strength due to partial reduction of thickness of the gate oxide film 7 is prevented. Thus, it is possible to achieve both a reduction of the ON resistance and an increase in the dielectric strength of a power MOSFET when the trench 6 is oriented in the manner of FIG. 4.

In addition, since the orientation flat is in a (111) plane, the mask alignment can be performed with reference to the orientation flat. Therefore, the mask alignment is relatively simple.

Third Embodiment

Figure 6:
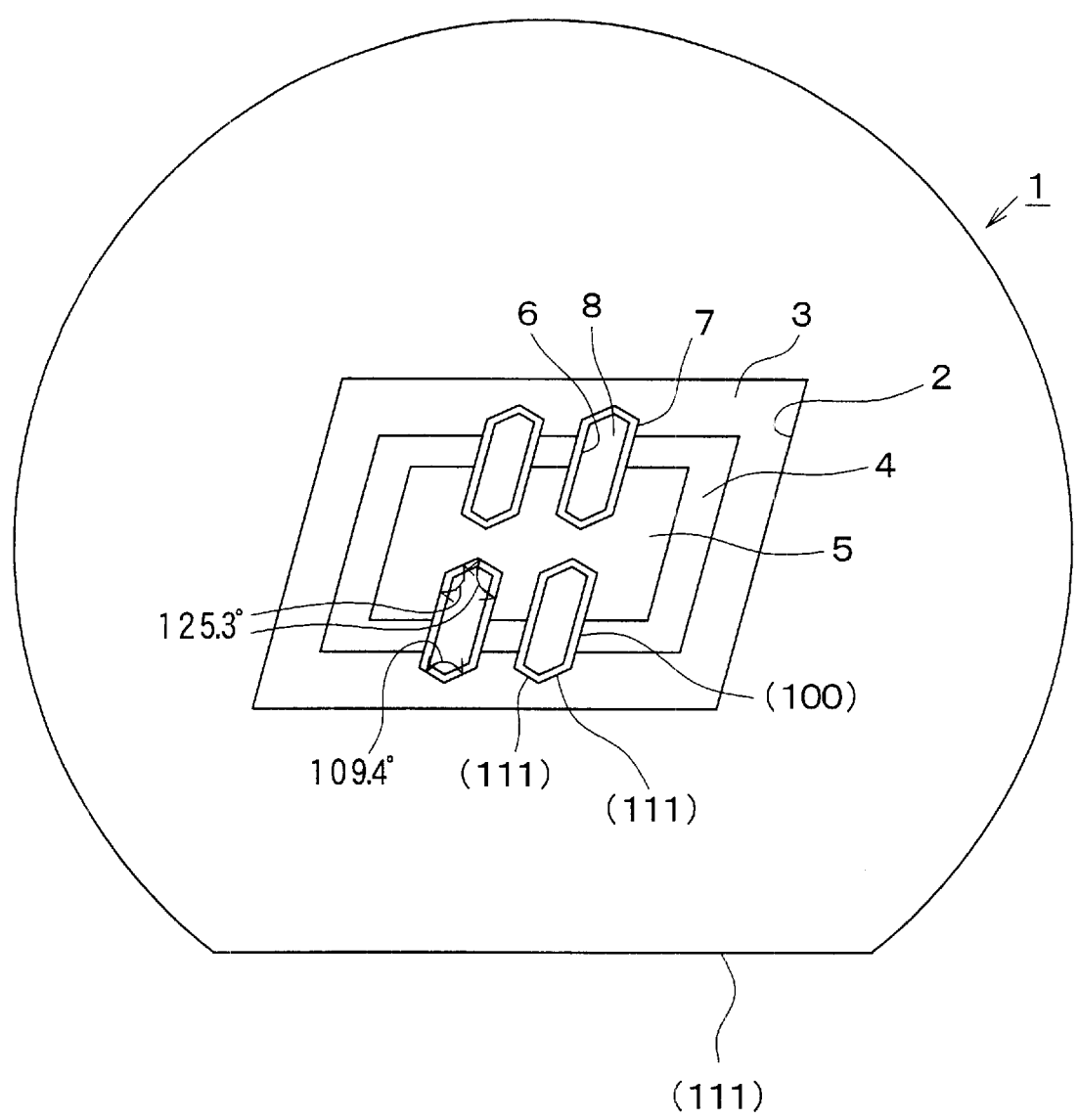
FIG. 6 is a top view of a power MOSFET of a third embodiment of the present invention.
Figure 7:
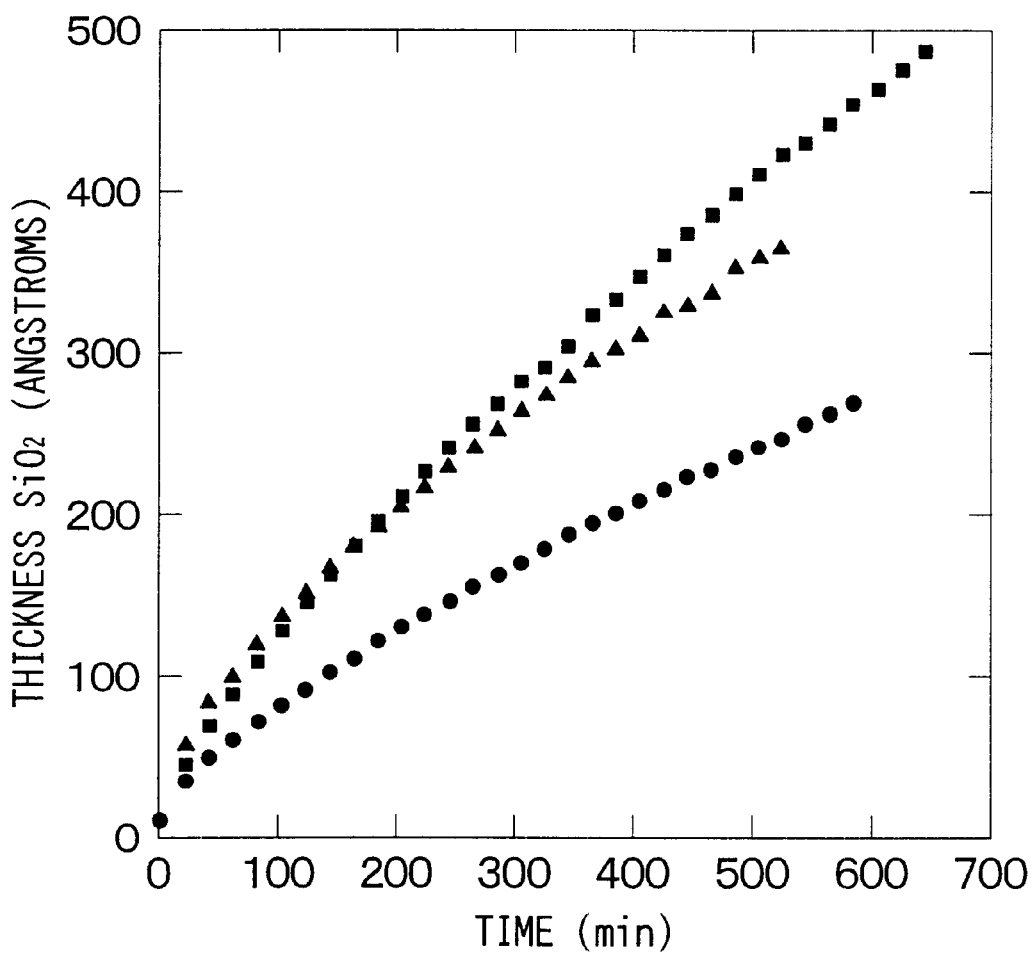
FIG. 7 is a characteristic diagram showing the growth rate of a thermally oxidized film in relation to the plane orientation.
Figure 8A:
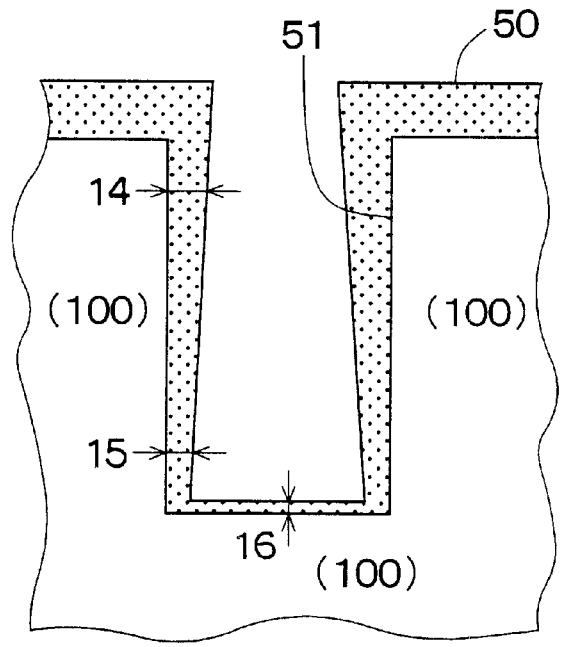
FIG. 8A is a cross sectional diagram showing a gate oxide film 50 that is formed in a prior art trench structure.
Figure 8B:
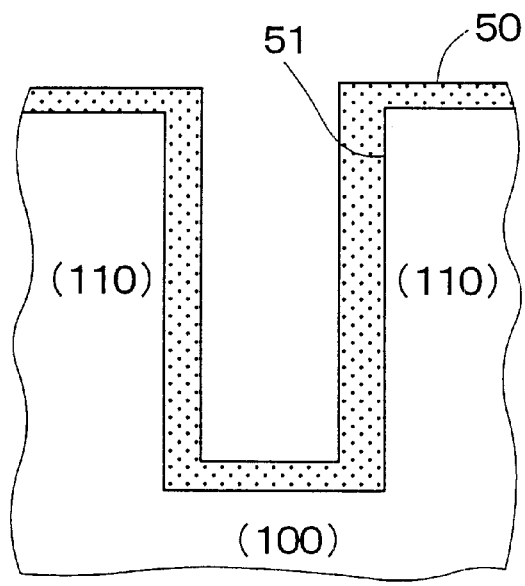
FIG. 8B is a cross sectional diagram showing a gate oxide film 50 that is formed in a prior art trench structure.

In the third embodiment of FIG. 6, only the layout of the trench 6 is different from that of the second embodiment.

In the second embodiment, the side walls of trench 6 are in (100) and (111) planes, and the shape of the trench 6 in the plan view is substantially a parallelogram. However, in the third embodiment, the shape of the trench 6 in the plan view is hexagonal, and only one pair of three pairs of side walls are in (100) planes. The remaining two pairs of opposed side walls are in (111) planes.

In the structure of the third embodiment, the relationship of the thicknesses of the gate oxide film 7 is similar to that in the second embodiment. However, the acute angles of the parallelogrammatic trench 6 of the second embodiment are changed to obtuse angles in the third embodiment. This arrangement prevents concentrations of electric field, which may be generated when the trench 6 has acute angles. Thus, a reduction of the dielectric strength of the gate oxide film 7 is further prevented.

Other Embodiments

The illustrated embodiments are examples of trench gate type semiconductor devices. However, the present invention can also be applied to an IGBT, which is formed by changing the $n^+$ type substrate 1 of FIG. 1 to a $p^+$ type substrate. Also, the invention can be applied to a power MOSFET or IGBT that includes a vertical type groove gate or the like.

In the second and third embodiments, the orientation flat is in a (111) plane, but the orientation flat may have any type of plane orientation that is parallel or vertical to each side of the trench 6. That is, the planes (100), (110) and (112) can also be selected in addition to the plane (111).

What is claimed is:

1. A trench gate type semiconductor device comprising:
 a silicon substrate, in which semiconductor layers are formed, wherein the silicon substrate includes a main surface and a rear surface, the rear surface being opposite to the main surface, and wherein the main surface is in a (110) plane;
 a trench formed in the semiconductor layers, wherein the trench has at least a first pair and a second pair of opposed sidewalls, and the first pair of sidewalls are in (100) planes;
 a gate oxide film formed by thermally oxidizing the walls of the trench;
 a gate electrode located on the gate oxide film inside the trench, wherein channels are formed at the first pair of side walls when a predetermined voltage is applied to the gate electrode.

2. A semiconductor device according to claim 1, wherein the walls of the second pair of sidewalls are in (110) planes.

3. A semiconductor device according to claim 2, wherein the substrate has an orientation flat in a (100) plane or a (110) plane.

4. A semiconductor device according to claim 1, wherein the substrate has an orientation flat in a (100) plane or a (110) plane.

5. A semiconductor device according to claim 1, wherein the walls of the second pair of sidewalls are in (111) planes.

6. A semiconductor device according to claim 1, wherein the trench has a third pair of opposed sidewalls, and the walls of the second and third pairs are in (111) planes.

7. A semiconductor device according to claim 6, wherein the substrate has an orientation flat in a (100) plane, a (111) plane, a (110) plane, or a (112) plane.

8. A semiconductor device according to claim 5, wherein the substrate has an orientation flat in a (100) plane, a (111) plane, a (110) plane, or a (112) plane.

9. A semiconductor device according to claim 1, wherein the trench is at least 15 µm deep from the main surface.

10. A semiconductor device according to claim 1, wherein the trench is a second trench, and a first trench is formed in the substrate, and wherein the semiconductor layers include a drift region layer, which has a first type of conductivity and is located in the first trench on the substrate, a base region layer, which has a second type of conductivity, and a source region layer, which has the first type of conductivity, wherein the second trench extends from the source region through the base region and into the drift region.

11. A semiconductor device according to claim 10, wherein a longitudinal axis of the first trench is transverse to a longitudinal axis of the second trench.

12. A semiconductor device according to claim 10, wherein the source region layer is embedded in the base region layer and the base region layer is embedded in the drift region layer.

13. A method of manufacturing a trench gate type semiconductor device comprising:

preparing a silicon substrate that includes semiconductor layers, a main surface and a rear surface, wherein the main surface is opposite to the rear surface and is oriented in a (110) plane;

forming a trench in the semiconductor layers, wherein the trench has at least a first pair and a second pair of opposed sidewalls, and the first pair of sidewalls are in (100) planes;

forming a gate oxide film by thermally oxidizing the walls of the trench;

forming a gate electrode on the gate oxide film inside the trench such that channels are formed at the walls that are in (100) planes when a predetermined voltage is applied to the gate electrode.

14. A method according to claim 13 including the step of forming the walls of the second pair of sidewalls in (110) planes.

15. A method according to claim 13 including the step of forming the walls of the second pair of sidewalls in (111) planes.

16. A method according to claim 13 including the step of forming a third pair of opposed sidewalls when forming the trench and the step of forming the walls of the second and third pairs of side walls in (111) planes.

17. A method according to claim 13, wherein the trench is a second trench, and the method includes forming a first trench in the substrate to contain the semiconductor layers, and the step of preparing a silicon substrate includes forming the semiconductor layers by forming a drift region layer in the first trench, wherein the drift layer has a first type of conductivity, forming a base region layer on the drift layer, wherein the base region layer has a second type of conductivity, and forming a source region layer on the base layer, wherein the source region layer has the first type of conductivity, and wherein the step of forming the second trench includes forming the second trench to extend from the source region layer through the base region layer and into the drift region layer.

18. A method according to claim 17, wherein the semiconductor layers are formed by epitaxial growth.

19. A method according to claim 13 including forming an orientation flat in the substrate in a (110) plane or a (111) plane.

* * * * *